(12) United States Patent
Froment

(10) Patent No.: US 10,651,436 B2
(45) Date of Patent: May 12, 2020

(54) REMOVABLE FLAP FOR CLOSING A LOCATION SUITED TO RECEIVING AT LEAST ONE BATTERY OF AN ELECTRONIC DEVICE AND CORRESPONDING ELECTRONIC DEVICE

(71) Applicant: INGENICO GROUP, Paris (FR)

(72) Inventor: Marion Froment, Loriol (FR)

(73) Assignee: INGENICO GROUP, Paris (FR)

( * ) Notice: Subject to any disclaimer, the term of this patent is extended or adjusted under 35 U.S.C. 154(b) by 0 days.

(21) Appl. No.: 15/779,610

(22) PCT Filed: Nov. 24, 2016

(86) PCT No.: PCT/EP2016/078733
§ 371 (c)(1),
(2) Date: May 29, 2018

(87) PCT Pub. No.: WO2017/089493
PCT Pub. Date: Jun. 1, 2017

(65) Prior Publication Data
US 2018/0375073 A1    Dec. 27, 2018

(30) Foreign Application Priority Data
Nov. 27, 2015  (FR) ...................... 15 61511

(51) Int. Cl.
*H01M 2/10* (2006.01)
*H05K 5/02* (2006.01)
*G07F 1/00* (2006.01)

(52) U.S. Cl.
CPC ............ *H01M 2/1066* (2013.01); *G07F 1/00* (2013.01); *H01M 2/1055* (2013.01); *H05K 5/0221* (2013.01)

(58) Field of Classification Search
None
See application file for complete search history.

(56) References Cited

U.S. PATENT DOCUMENTS 4,191,917 A * 3/1980 Brown ................. H01M 10/46
                                                              307/150
4,391,883 A * 7/1983 Williamson ........ H01M 2/1055
                                                              429/100
(Continued)

FOREIGN PATENT DOCUMENTS

GB          2315936 A     2/1998

OTHER PUBLICATIONS

International Search Report dated Dec. 13, 2016 for corresponding International Application No. PCT/EP2016/078733, filed Nov. 24, 2016.
(Continued)

*Primary Examiner* — Xanthia C Cunningham
(74) *Attorney, Agent, or Firm* — David D. Brush; Westman, Champlin & Koehler, P.A.

(57) ABSTRACT

A removable flap for closing a location adapted to receiving at least one battery of an electronic device. The flap has, on at least one side, at least one first protrusion in the form of a tab adapted to release, via a first part located in a same plane as the flap, at least one corresponding area for holding the battery in the location. The flap is also adapted to lever and pivot the battery via a second part situated in a plane substantially perpendicular to that of the flap.

9 Claims, 8 Drawing Sheets

(56) References Cited

U.S. PATENT DOCUMENTS

| | | | | | |
|---|---|---|---|---|---|
| 5,337,215 | A | * | 8/1994 | Sunderland | H01M 2/1055 200/43.22 |
| 5,508,124 | A | * | 4/1996 | Gordecki | H01M 2/1055 429/100 |
| 5,554,822 | A | * | 9/1996 | Gilpin | G06K 13/08 174/542 |
| 5,567,545 | A | * | 10/1996 | Murakami | H01M 2/1022 429/100 |
| 5,714,716 | A | * | 2/1998 | Yamada | H01M 2/1044 174/535 |
| 6,338,914 | B1 | * | 1/2002 | Schuurmans | H01M 2/1055 429/100 |
| 6,463,221 | B2 | * | 10/2002 | Morinaga | G03B 17/02 396/536 |
| 6,875,041 | B1 | * | 4/2005 | Chang | H01R 13/635 439/347 |
| 7,212,146 | B2 | * | 5/2007 | Nakamura | H01H 9/0235 341/176 |
| 7,492,273 | B2 | * | 2/2009 | Sharpe | G08B 29/181 340/628 |
| 7,832,652 | B2 | * | 11/2010 | Barton | H01M 2/1055 236/51 |
| 7,929,277 | B2 | * | 4/2011 | Yang | H04M 1/0262 361/679.01 |
| 8,257,852 | B2 | * | 9/2012 | Zeng | H01M 2/1066 429/100 |
| 8,693,190 | B2 | * | 4/2014 | Chang | G06F 1/1679 312/223.1 |
| 8,934,226 | B2 | * | 1/2015 | Smith | G06F 1/1613 361/679.2 |
| 8,935,438 | B1 | * | 1/2015 | Ivanchenko | G06F 1/1626 361/679.31 |
| 2004/0080916 | A1 | | 4/2004 | Hsu et al. | |
| 2007/0196726 | A1 | * | 8/2007 | Nakashima | H01M 2/1066 429/99 |
| 2008/0096617 | A1 | * | 4/2008 | Hwang | H01M 2/1066 455/575.1 |
| 2010/0119924 | A1 | * | 5/2010 | Wang | H01M 2/1066 429/98 |
| 2015/0340668 | A1 | * | 11/2015 | Hu | H01M 2/1022 429/176 |
| 2017/0012254 | A1 | * | 1/2017 | Takahashi | H01M 2/1022 |

OTHER PUBLICATIONS

English translation of the International Written Opinion dated Dec. 13, 2016 for corresponding International Application No. PCT/EP2016/078733, filed Nov. 24, 2016.

* cited by examiner

REMOVABLE FLAP FOR CLOSING A LOCATION SUITED TO RECEIVING AT LEAST ONE BATTERY OF AN ELECTRONIC DEVICE AND CORRESPONDING ELECTRONIC DEVICE

CROSS-REFERENCE TO RELATED APPLICATIONS

This Application is a Section 371 National Stage Application of International Application No. PCT/EP2016/078733, filed Nov. 24, 2016, which is incorporated by reference in its entirety and published as WO 2017/089493 A1 on Jun. 1, 2017, not in English.

1. FIELD OF THE INVENTION

The proposed technique relates to the extraction of a battery from an electronic device and more specifically to an electronic payment terminal.

2. PRIOR ART

For most electronic devices having a removable battery, a tool (for example a screwdriver or a key or a pen) is needed to remove this battery (for example in order to change it) when the access flap is open. The fact is that, in most cases, the small size of the battery and its location make it difficult to remove it by hand without any tool. Now, the use of an inappropriate tool increases the risk of damaging the battery or its location and ultimately prevents proper maintenance of the battery in its location or the proper functioning of the battery (for example because of a lack of contacts if the battery is not properly placed in its location).

Moreover, in certain cases, the user who needs to change the battery may not have a tool with which to remove it, thus delaying the changing of the battery. This situation can cause problems for example in the case of an electronic payment terminal that the merchant absolutely needs for his business.

There is therefore a need for a solution to make it easier to remove a battery from an electronic device while ensuring the integrity of the battery and of its location as well as the speed and ergonomy of its removal for the user.

3. SUMMARY

The proposed technique is without at least some of the problems of the prior art. More particularly, the proposed technique relates to a removable flap for closing a location adapted to receiving at least one battery of an electronic device, the flap having, on at least one side, at least one first protrusion in the form of a tab adapted to releasing, via a first part located in a same plane as the flap, at least one corresponding area for holding the battery in the location and adapted to levering and pivoting the battery via a second part situated in a plane substantially perpendicular to that of the flap.

Thus, the invention proposes a novel and inventive solution to facilitate the removal of a battery from an electronic device, for example an electronic payment terminal, by using the (removable) flap for closing the location of the battery as a tool to remove the battery.

To this end, the flap for closing the battery location is adapted so as to enable, on the one hand, the release of at least one area (in the battery location) for holding the battery in its location, and, on the other hand, the removal of the battery once the holding area has been released.

Thus, the flap has at least one protrusion in the shape of a "tab" or hook, a first part of which is situated in the plane of the flap, to release the holding area, and a second part of which is situated in a plane substantially perpendicular to that of the flap, so as to exert a "mechanical shovel" function enabling it to lever the battery to pivot it and thus easily remove it from its location.

In particular, the second part of the first protrusion has a curved external shape suited to levering the battery.

Thus, according to this embodiment, the first protrusion is curved outwardly so that it can tilt the flap to make it lever the battery and make it pivot so that can easily be removed from its location.

According to one particular aspect, the flap has at least one second protrusion suited to releasing at least one second corresponding area for holding the battery in the location, the second protrusion being situated substantially in the same plane as the flap.

Thus, according to this embodiment, the flap for closing the battery location has two protrusions, to enable the releasing of at least two areas (in the battery location) for holding the battery in its location.

To this end, the first tab-shaped or hook-shaped protrusion enables both the releasing of a holding area via its first part, substantially in the same plane as the flap, and the levering of the battery to pivot it, via its second part, in a plane perpendicular to the flap, to remove the battery from the location (once the holding area or areas have been released) and the second protrusion enables the releasing of the second battery-holding area. The second protrusion can therefore be situated substantially in the same plane as that of the flap.

This embodiment makes it possible to adapt to the technical solutions provided to meet the requirements of solidity and space requirement in the design of the location for the battery of an electronic device. These technical solutions provide two battery-holding areas to be released so that the battery can be removed from its location.

In particular, the flap can take at least three positions:
a closing position in which the flap closes the location for receiving the battery;
a position of releasing the battery in which the protrusion or protrusions of the flap release the holding area or areas;
a position of removal in which the first protrusion levers the battery and makes it pivot out of the location.

Thus, according to this second embodiment, the flap which classically serves to close the battery location can be used to remove the battery from its location through a two-stage movement. In a first stage, the flap serves to release the battery-holding area or areas through the protrusion or through the two protrusions and then, in a second stage, the first protrusion (tab-shaped or hook-shaped and constituted by two substantially perpendicular parts) levers the battery and makes it pivot so that it is easily removed from its location.

According to one particular characteristic, the protrusion or protrusions are inserted into one or two housings of the location for receiving the battery in the closing position, the housing or housings being situated at an extremity opposite to the area or areas for holding the battery in the location.

Thus, according to this embodiment, the protrusion or protrusions provided to extract the battery from its location are not flush when the battery is closed but are protected because they are inserted into one or two housings of the battery location provided for this purpose.

In addition, this housing or these two housings for the protrusions are situated so as to be substantially opposite, in the battery location, to the two battery-holding areas. Indeed, since the protrusions cannot serve to release the battery-holding areas and at the same time enable the closing of the flap, in one and the same position of this flap, the protrusions of the flap have to be inserted, in the closing position, into the battery location at a position other than the position in which the battery-holding areas are situated.

This means that the flap must be withdrawn from its closing position and then turned around so that it can be used as a tool for extracting the battery.

For example, the battery-holding area or areas in the location correspond to one or more lugs and, in the released position, the protrusion or protrusions of the flap exert a pressing force respectively on each of the lugs.

Thus, according to this embodiment, when the battery-holding areas in the location take the form of one or two lugs (for reasons related to the compactness of the location), the protrusion or protrusions enable these lugs to be pressed upon in order to release the battery, in the releasing position.

The invention also relates to an electronic device comprising a removable flap for closing a location adapted to receiving at least one battery as described here above.

In particular, such an electronic device corresponds to an electronic payment terminal having a location adapted to receiving a battery, the location having at least two battery-holding lugs.

4. FIGURES

Other features and advantages shall appear more clearly from the following description of a particular embodiment of the disclosure, given by way of a simple illustratory and non-exhaustive example, and from the appended drawings of which:

Figure 3:
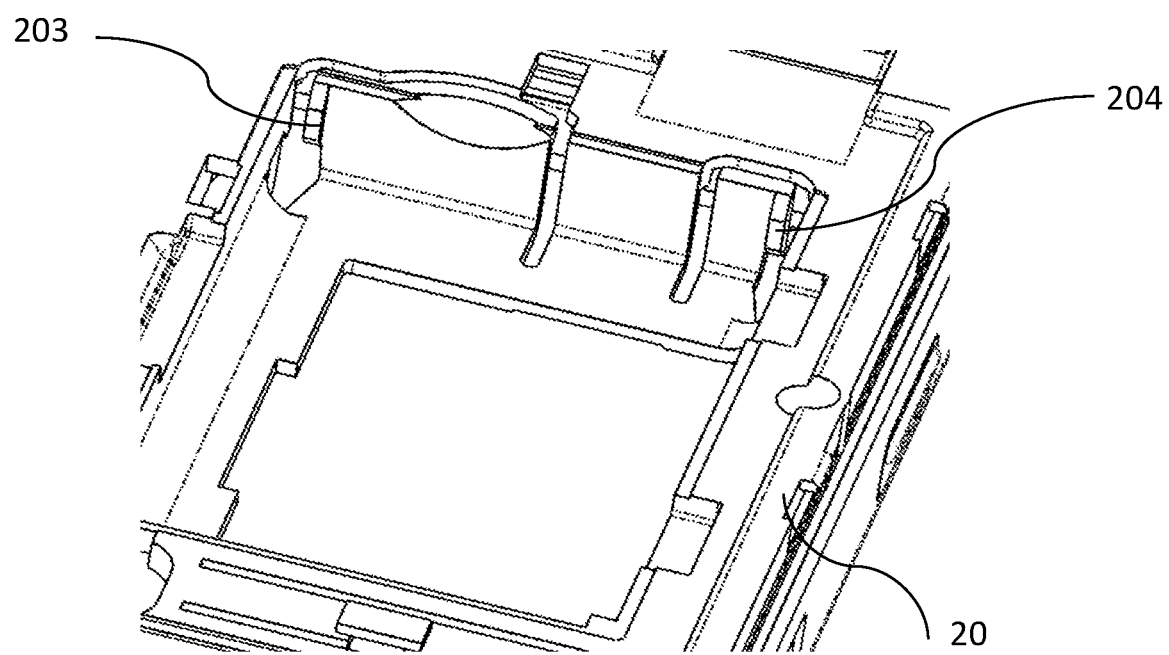
Figure 4A:
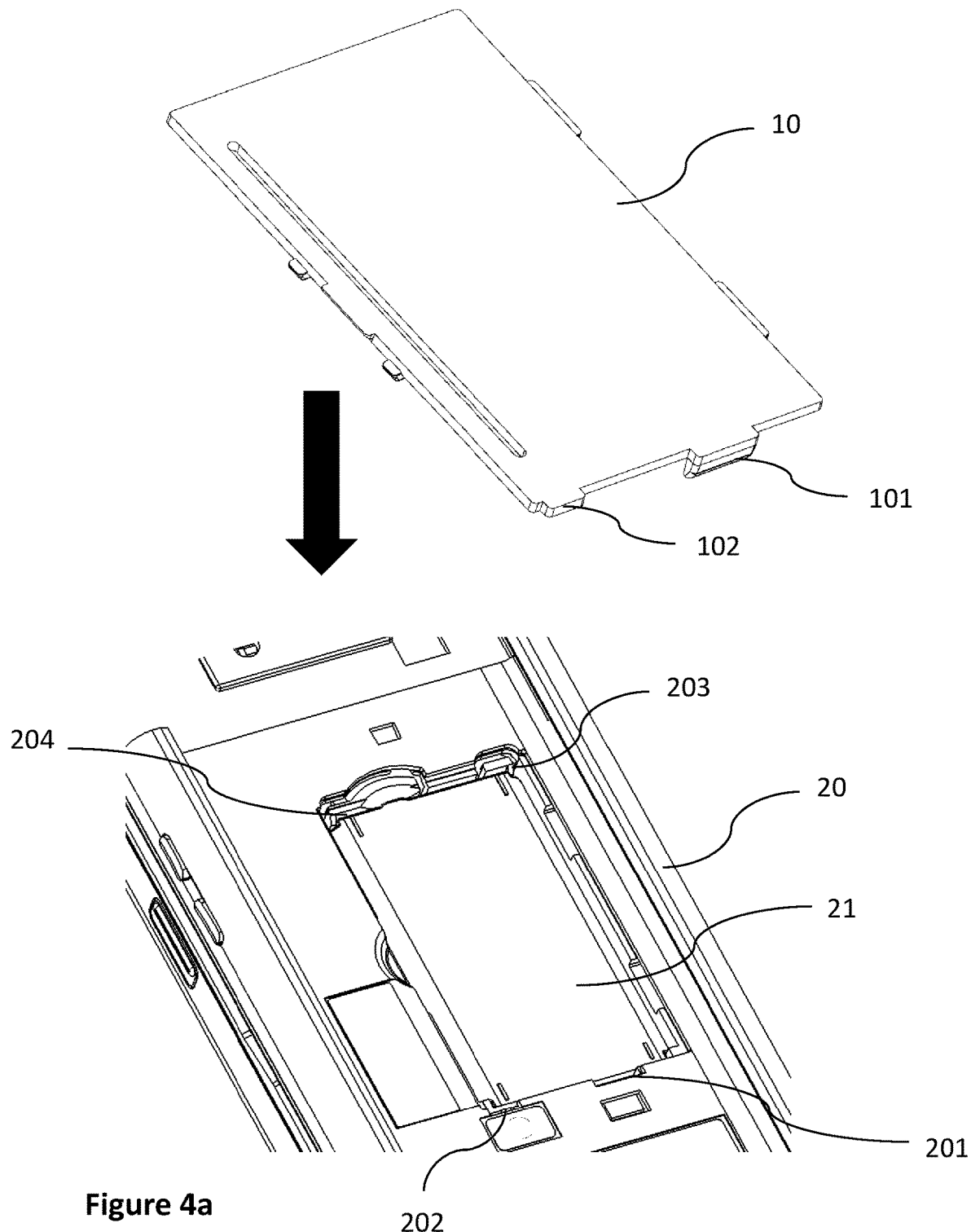
Figure 4B:
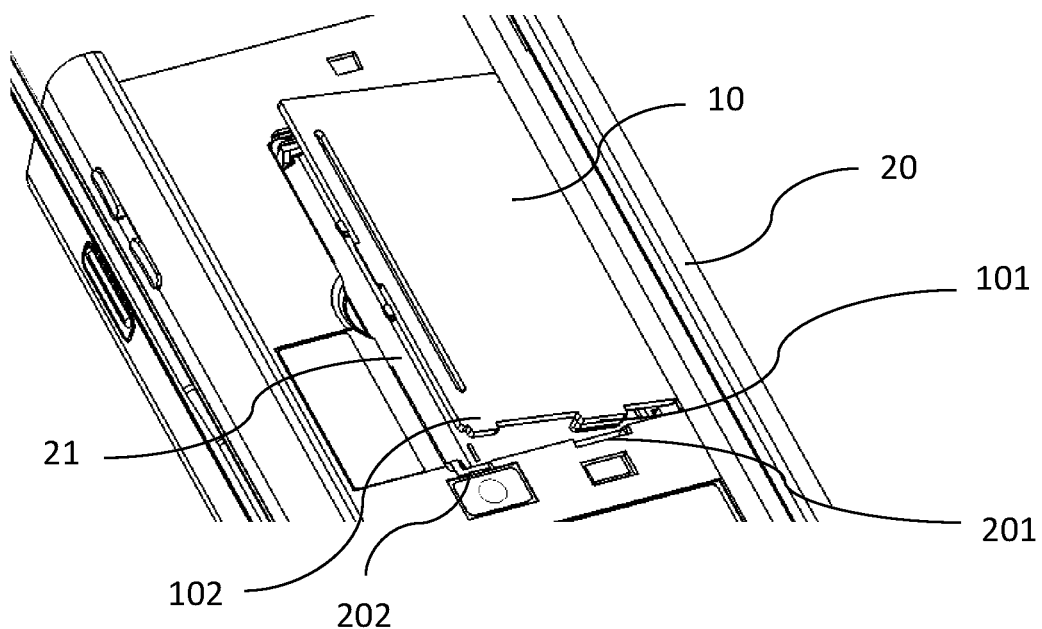
Figure 4C:
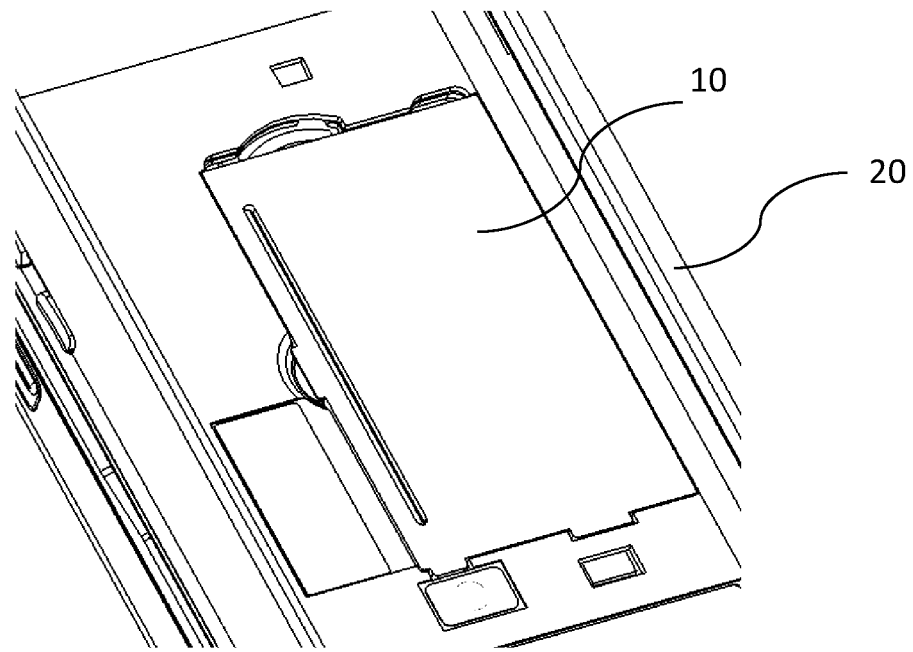
Figure 5A:
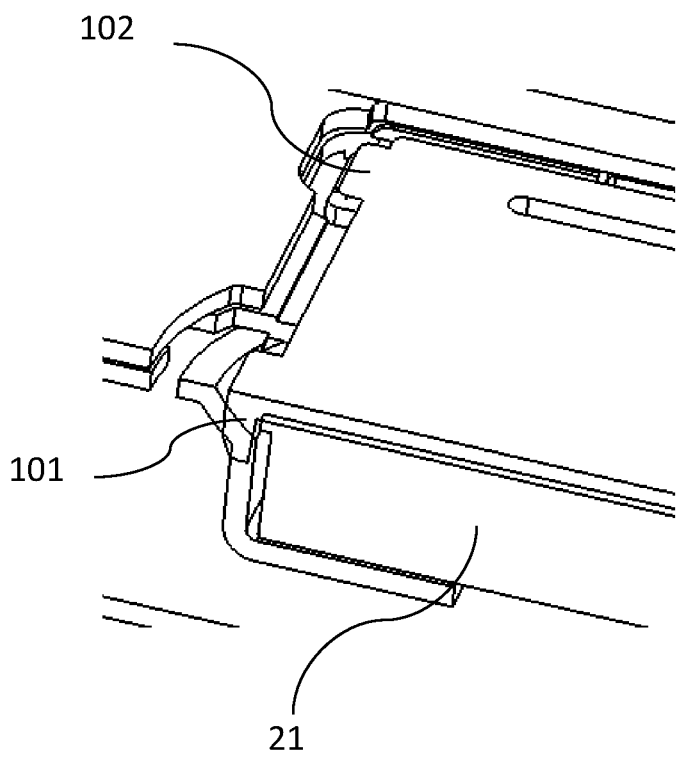
Figure 5B:
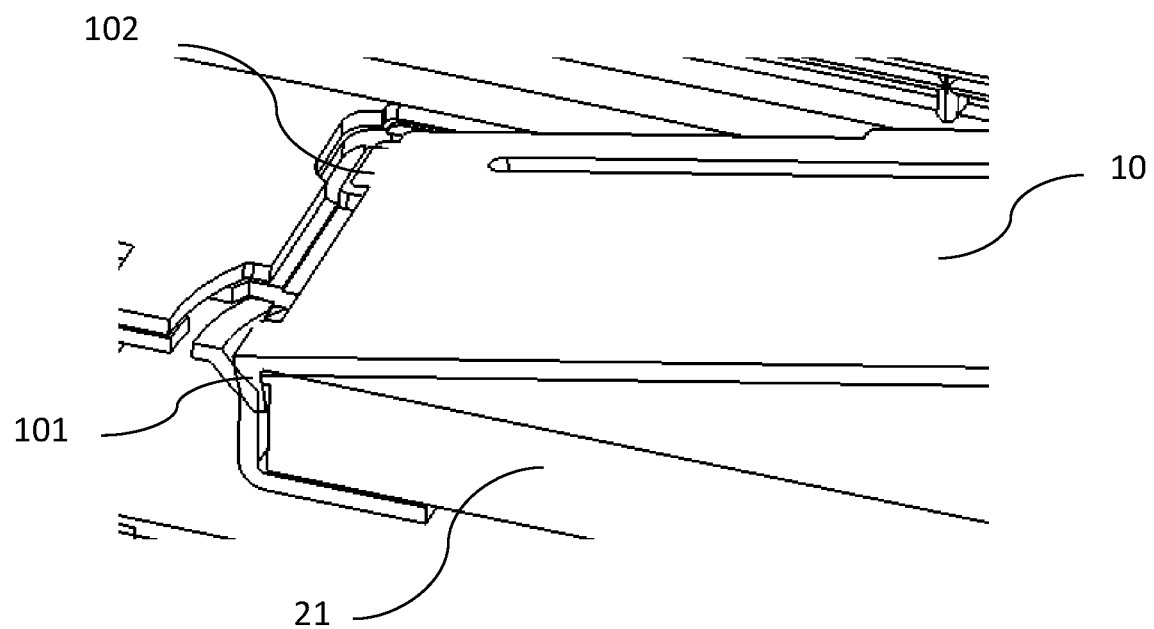

FIG. 3 presents an example of a battery location relative to the second embodiment of the invention;

FIGS. 4a to 4c illustrate three views of a flap, respectively a top view of the battery location of an electronic payment terminal, a view of this location when it is being closed and a view of the location when it is closed according to the second embodiment of the invention;

FIGS. 5a and 5b illustrate two views of the flap, respectively in battery-releasing position and in battery-removal position, according to the second embodiment of the invention.

5. DESCRIPTION

5.1. General Principle

According to the general principle of the proposed technique, the flap for closing the battery location of an electronic device is adapted to give it the function of a battery-removal tool intrinsic to the device.

To this end, the modified flap has at least one tab-shaped or hook-shaped protrusion intended both to release at least one area for holding the battery in its location and to "hook" the battery once it is released so that the battery can be levered and thus pivoted and easily removed it from its location.

Thus, a user wishing to replace the battery of an electronic device (for example an electronic payment terminal) can use the battery-location closing flap as a tool to remove the battery, without needing to use another distinct tool. In this way, the adapted flap, according to the different embodiments of the invention, is specifically designed to enable the removal of the battery without damaging either the battery or the battery location, unlike the inappropriate tools (pen, screwdriver, key etc.) that are commonly used without any solution "intrinsic" to the electronic device.

It will be noted that the application can be applied to any electronic device having a location for a removable battery closed by a flap, capable of being adapted to the different embodiments of the invention.

5.2. Description of a First Embodiment

Figure 1A:
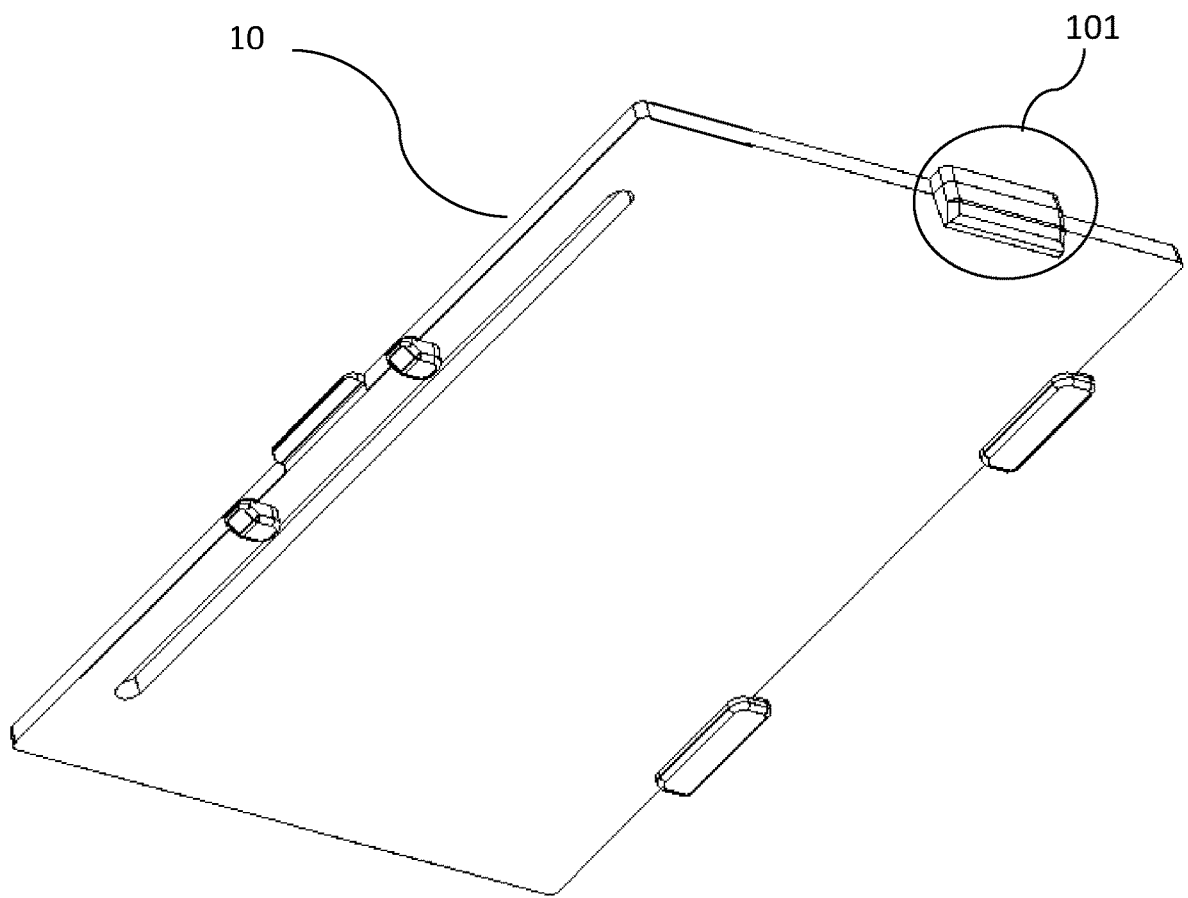
FIGS. 1a and 1b illustrate a flap, respectively in a bottom view and a top view, according to a first embodiment of the invention.
Figure 1B:
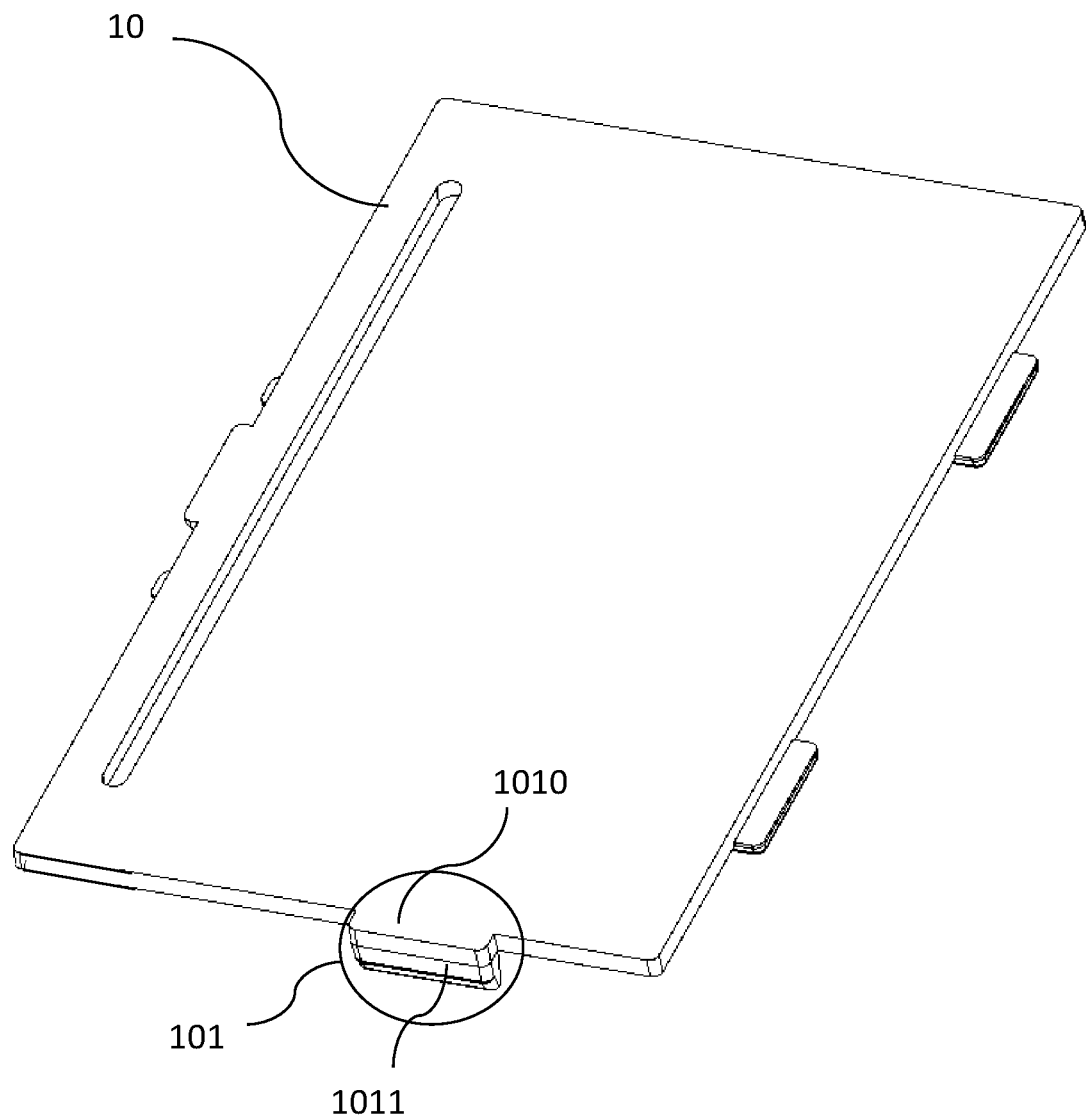

Referring now to FIGS. 1a and 1b (respectively in a top view and a bottom view of the flap) a description is provided of a first embodiment of the invention in which the flap 10 for closing the battery location of an electronic device has a protrusion 101 adapted to enabling the removal of the battery from a location having an area for holding this battery.

As illustrated in FIG. 1b, the protrusion 101, here below called the first protrusion, has the shape of a tab or hook formed out of two parts 1010 and 1011 enabling the flap to be given the following two functions:
- a first function for releasing the area for holding the battery in its location, by pressure on this holding area of the first part 1010 which extends beyond the flap substantially in the same plane as that of a flap;
- a second function of a "hook" or "mechanical shovel" enabling the battery to be hooked once released from its holding area, through the second part 1011 situated in a plane substantially perpendicular to that of the flap.

For example, the holding area (in the battery location) conventionally takes the form a plastic lug that can be used to hold the battery when it is inserted into its location and that therefore needs to be pushed so that the battery can be released. To this end, the first part 1010 of the first protrusion 101 of the flap 10 has for example a length sufficient for it to press on this lug and thus release the hold that it exerts on the battery. For reasons of simplicity of manufacture, this first part is situated substantially in the same plane as the flap.

In addition, the second part 1011 of the first protrusion 101 of the flap 10 is situated for example in a plane substantially perpendicular to that of the flap so that it can lever the released battery and be able to pivot it so that it can be removed from its location. Here again, this second part 1011 has a length sufficient for it to be able to "hook" the battery. This length can therefore depend on the thickness of the battery. In addition, this second part is curved outwardly so that the flap can be tilted once the battery is released, to lever the battery and make it pivot.

As described here below with reference to FIGS. 4c, 5a and 5b, the flap can thus take at least three positions:
- a position in which the battery location is closed (FIG. 4c);
- a position in which the areas for holding the battery in its location are released, through the pressing of the protrusion or protrusions on these holding areas (FIG. 5a);

a position for removing the battery from its location, through the use of the first protrusion as a "hook" to lever the battery and make it pivot (FIG. 5b).

it is clearly understood that the battery-holding area can take a form different from that of plastic lug, provided that it enables the battery to be held in its location in use mode while enabling the removal of the battery (for example for reasons of maintenance or replacement of this battery by another pre-recharged battery for the continuous use of the electronic device).

5.3. Description of a Second Embodiment

Figure 2A:
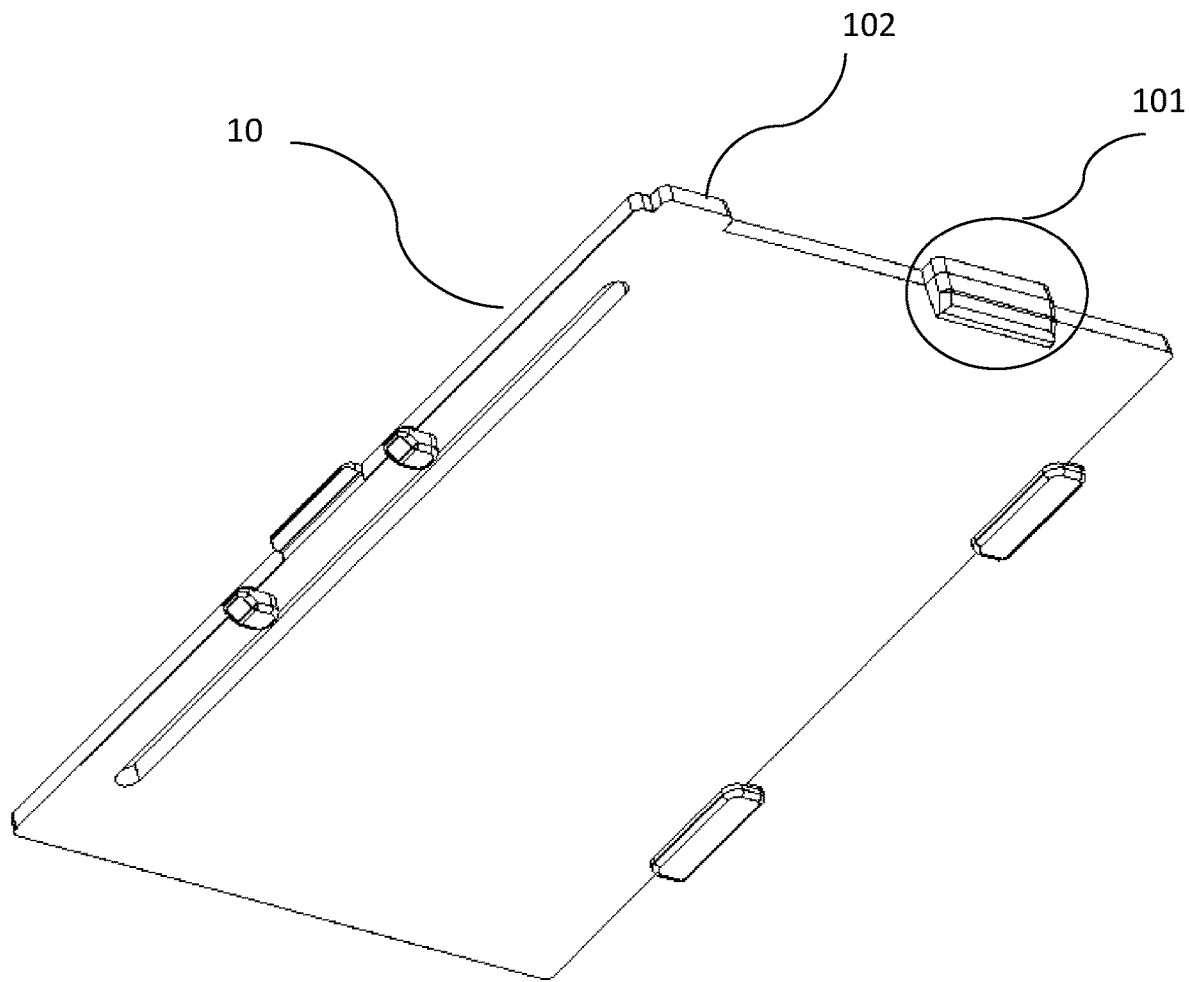
FIGS. 2a and 2b illustrate a flap, respectively in a bottom view and a top view, according to a second embodiment of the invention.
Figure 2B:
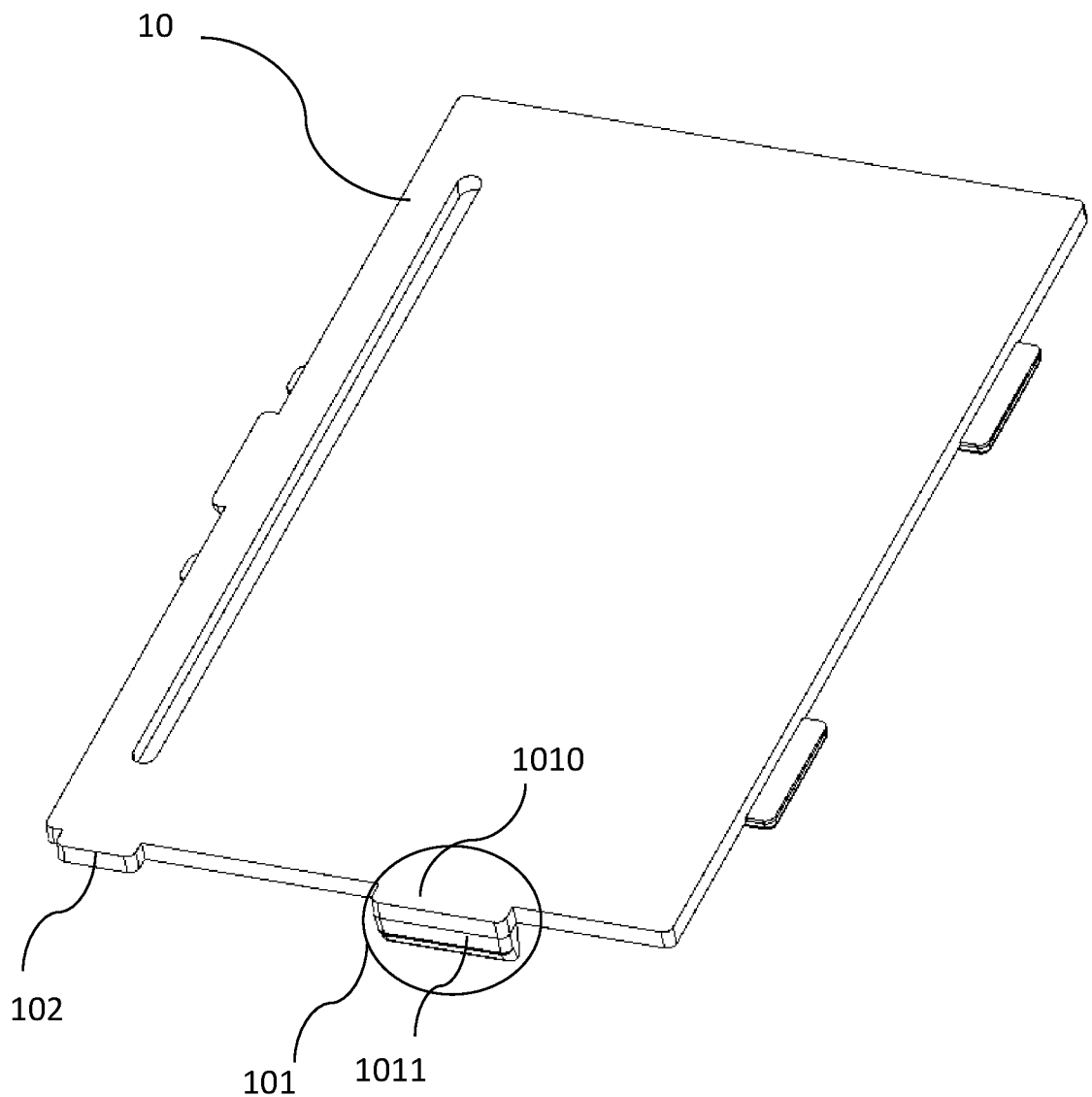

Referring now to FIGS. 2a and 2b, we describe a second embodiment of the invention in which the flap 10 for closing the battery location of an electronic device has a second protrusion 102 in addition to the one designed and described with reference to the first embodiment.

According to this second embodiment, the flap 10 (shown in FIGS. 2a and 2b respectively in a top view and a bottom view) is therefore suited to enabling the removal of the battery from a location having two areas for maintaining this battery, through the two protrusions 101 and 102.

The first protrusion 101, already described with reference to the first embodiment, in the shape of a tab or hook, fulfils both the function of releasing a holding area and the function of a lever to cause the battery to pivot. The second protrusion 102 is suited to releasing the second area for holding the battery in its location. To this end, the second protrusion 102 is situated appreciably in the same plane as the flap and enables the second holding area (for example a lug) to be pressed on and thus release the battery.

FIG. 3 illustrates an example of a battery location (without the battery) of an electronic device 20 having two battery-holding areas in the form of lugs 203 and 204, intended for holding the battery when it is inserted into the location, through the pressing of the lugs on the battery.

According to this second embodiment, the protrusions 101 and 102 of the flap 10 therefore enable the releasing of these two lugs 203 and 204 by pressing on them so that the battery is no longer held by these two lugs.

It must be noted that, depending on the position of the holding areas (for example lugs) of the battery in the location, the position of the protrusions on the flap is adapted in such a way that the protrusions are situated facing the holding areas, in the battery-releasing position.

In addition, as described in greater detail here below, in the battery location, opposite to the battery-holding areas (as illustrated in FIGS. 4a to 4c described here below), two housings are provided to receive the two protrusions of the flap, when this flap is in the position for closing the battery location. Indeed, these two protrusions must not be placed so as to be facing the battery-holding areas in the closed position of the flap so that they do not press on these areas when the flap has closed the location in which the battery must be held. It is therefore provided that the flap 10 must be first removed from the battery location and then turned around so that it can act as a tool to remove the battery.

5.4. Description of a Case of Use

Referring now to FIGS. 4a to 4c and 5a to 5b, we describe an example of a use of a flap 10 according to the second embodiment of the invention described here above.

It may be recalled that, according to this second embodiment, the flap 10 has at least two protrusions 101 and 102 to enable the removal of the battery from its location.

a) Closing the Battery Location Through the Flap

Referring to FIGS. 4a to 4c, we present first of all the flap-closing mechanism, enabling the battery location to be closed by means of the flap 10, once the battery 21 is inserted into the electronic device 20.

The top part of FIG. 4a shows a view of the flap that is to be positioned above the battery by a movement, the sense of which is indicated by the arrow, to close the battery location.

As for the bottom part of FIG. 4a, it shows a part of the electronic device 20 with a battery 21 inserted into its location. This location has two housings 201 and 202 that are to receive respectively the protrusions 101 and 102 of the flap, in the closed position of the flap, as well as the two battery-holding areas 203 and 204.

For example, according to this second embodiment, the first housing 201 has a first part that is to receive first part 1010 of the first protrusion 101 and a second part that is to receive the second part 1011 of the first protrusion 101. As for the second housing 202, it has only one part that can receive the protrusion 102. It is clear that the housings therefore have a shape adapted to that of the protrusions so that the flap can ensure a full closure of the battery location.

FIG. 4b shows a view of the flap during the closing of the battery location, while it is almost entirely covering the battery. The two protrusions 101 and 102 however have not yet been inserted into their respective housings 201 and 202.

FIG. 4c shows a view of the flap in the closed position of the battery location, this location being no longer visible because it is totally concealed beneath the flap 10.

b) Removal of the Battery Through the Flap

FIGS. 5a and 5b illustrate the mechanism of removal of the battery by the flap 10 according to this second embodiment of the invention, respectively in the position of release of the battery-holding areas and the position of the removal of the battery by the pivoting of this battery.

To use the flap 10 as a tool for removing the battery, it may be recalled here that the flap must be removed from its location and turned around in such a way that its two protrusions 101 and 102 are facing the two holding areas 203 and 204 (illustrated in FIG. 3 in the form of lugs).

According to FIG. 5, the flap is positioned so that the protrusions 101 and 102 press on the holding zones, for example the lugs, in order to release the battery 21.

Then, once the battery is released from the pressure of these two lugs, the flap is tilted so that the protrusion 101 and more particularly its second curved part 1011 lever the battery 21 to make it pivot, as illustrated in FIG. 5b, until it is removed from its location (not shown).

Thus, the user can remove the battery from its location in using the flap for closing this location, which is adapted, according to the different embodiments of the invention, to offering the additional function (intrinsic to the device) of a tool for removing the battery.

The invention claimed is:

1. A removable flap for closing a location adapted to receiving at least one battery of an electronic device, said flap comprising:
   on at least one side, at least one first protrusion in the form of a tab adapted, after the flap being removed from the battery location and turned around, without any removal effect on said battery, to release, via a first part located in a same plane as said flap, at least one corresponding area for holding said battery in said location and adapted to lever and pivot said battery via a second part situated in a plane substantially perpendicular to that of said flap.

2. The flap according to claim 1, wherein said second part of said first protrusion has a curved external shape adapted to lever said battery.

3. The flap according to claim 1, wherein the flap has at least one second protrusion adapted to release at least one second corresponding area for holding said battery in said location, said second protrusion being situated substantially in the same plane as said flap.

4. The flap according to claim 1, wherein the flap can take at least three positions:
   a closing position in which said flap closes said location for receiving said battery;
   a position of releasing said battery in which said at least one protrusion of said flap releases said at least one holding area;
   a position of removal in which said first protrusion levers said battery and makes said battery pivot out of said location.

5. The flap according to claim 4, wherein said at least one protrusion is inserted into one or two housings of said location for receiving said battery in said closing position, said at least one housing being situated at an extremity opposite said, at least one corresponding area for holding said battery in said location.

6. The flap according to claim 5, wherein said at least one corresponding area in said location corresponds to one or more lugs and wherein, in said released position, said at least one protrusion of said flap exerts a pressing force respectively on each of said lugs.

7. An electronic device comprising the removable flap for closing a location adapted to receiving at least one battery according to claim 1.

8. The electronic device according to claim 7, the electronic device corresponds to an electronic payment terminal having the location adapted to receive the battery, said location having at least two lugs for holding said battery.

9. An electronic device comprising:
   a battery location for receiving a battery;
   at least one battery holding area, which is configured to hold the battery in the battery location;
   at least one protrusion housing arranged relative to the battery location; and
   a removable flap for closing the battery location, said flap comprising:
      a first orientation;
      a second orientation, different from the first orientation, and corresponding to a position of the flap after being removed from the battery location and turned around, without any removal effect on said battery; and
      on at least one side of the flap, at least one first protrusion in the form of a tab comprising a first part located in a same plane as said flap and a second part situated in a plane substantially perpendicular to that of said flap;
      wherein when the flap has the first orientation, the flap closes the battery location and the at least one first protrusion is located in the at least one protrusion housing; and
      wherein when the flap has the second orientation, the first part of the at least one first protrusion presses on the at least one holding area to release the battery from the holding area, and the second part of the at least one protrusion forms a pivotable lever that acts on the battery once released from the holding area by the first part to remove the battery from the battery location.

* * * * *